(12) United States Patent
Xi et al.

(10) Patent No.: US 7,026,238 B2
(45) Date of Patent: Apr. 11, 2006

(54) RELIABILITY BARRIER INTEGRATION FOR CU APPLICATION

(75) Inventors: Ming Xi, Milpitas, CA (US); Paul Frederick Smith, San Jose, CA (US); Ling Chen, Sunnyvale, CA (US); Michael X. Yang, Palo Alto, CA (US); Mei Chang, Saratoga, CA (US); Fusen Chen, Cupertino, CA (US); Christophe Marcadal, Santa Clara, CA (US); Jenny C. Lin, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 418 days.

(21) Appl. No.: 10/052,681

(22) Filed: Jan. 17, 2002

(65) Prior Publication Data

US 2002/0060363 A1 May 23, 2002

Related U.S. Application Data

(63) Continuation-in-part of application No. 08/856,116, filed on May 14, 1997.

(51) Int. Cl.
*H01L 21/4763* (2006.01)

(52) U.S. Cl. .................. 438/625; 438/639; 438/643; 438/648

(58) Field of Classification Search ............. 438/642, 438/643, 644, 648, 652, 653, 672, 675, 680, 438/679, 702
See application file for complete search history.

(56) References Cited

U.S. PATENT DOCUMENTS

| | | | |
|---|---|---|---|
| 3,607,384 A | 9/1971 | Banks | 117/215 |
| 4,169,032 A | 9/1979 | Haase et al. | 204/192 F |
| 4,364,099 A | 12/1982 | Koyama et al. | 361/305 |
| 4,491,509 A | 1/1985 | Krause | 204/192 R |
| 4,760,369 A | 7/1988 | Tiku | 338/308 |

(Continued)

FOREIGN PATENT DOCUMENTS

| | | |
|---|---|---|
| EP | 0 818 817 | 1/1998 |
| JP | 05-179437 | 7/1993 |
| JP | 09-186157 | 7/1997 |
| WO | WO 98/52219 | 11/1998 |
| WO | WO 98/54377 | 12/1998 |
| WO | WO 00/38225 | 6/2000 |
| WO | WO 00/41235 | 7/2000 |

OTHER PUBLICATIONS

K. Min et al., "Comparative Study of Tantalum and Tantalum Nitride as a Diffusion Barrier for CU Metallization" J. Vac. Sc. Technol. B 14(5), Sep./Oct. 1996, p 1–7.
International Search Report for PCT/US01/26751, dated May 27, 2002.
International Search Report for PCT/US01/24880, dated May 17, 2002.
International Search Report for PCT/US98/09751, dated Sep. 16, 1998.

*Primary Examiner*—Hoai Pham
*Assistant Examiner*—Ginette Peralta
(74) *Attorney, Agent, or Firm*—Moser, Patterson & Sheridan LLP

(57) ABSTRACT

Embodiments of the present invention provide a process sequence and related hardware for filling a patterned feature on a substrate with a metal, such as copper. The sequence comprises first forming a reliable barrier layer in the patterned feature to prevent diffusion of the metal into the dielectric layer through which the patterned feature is formed. One sequence comprises forming a generally conformal barrier layer over a patterned dielectric, etching the barrier layer at the bottom of the patterned feature, depositing a second barrier layer, and then filling the patterned feature with a metal, such as copper.

21 Claims, 5 Drawing Sheets

U.S. PATENT DOCUMENTS

| | | | |
|---|---|---|---|
| 4,782,380 A | 11/1988 | Shankar et al. | 357/71 |
| 4,999,096 A | 3/1991 | Nihei et al. | 204/192.3 |
| 5,910,880 A | 6/1999 | DeBoer et al. | 361/311 |
| 5,933,753 A | 8/1999 | Simon et al. | 438/629 |
| 5,972,178 A | 10/1999 | Narasimhan et al. | 204/192.17 |
| 5,972,179 A | 10/1999 | Chittipeddi et al. | 204/192.17 |
| 5,985,762 A | 11/1999 | Geffken et al. | 438/687 |
| 5,989,999 A | 11/1999 | Levine et al. | 438/627 |
| 6,002,174 A | 12/1999 | Akram et al. | 257/751 |
| 6,007,684 A | 12/1999 | Fu et al. | 204/192.17 |
| 6,013,576 A | 1/2000 | Oh et al. | 438/648 |
| 6,028,003 A | 2/2000 | Frisa et al. | 438/653 |

RELIABILITY BARRIER INTEGRATION FOR CU APPLICATION

RELATED APPLICATIONS

This application is a continuation-in-part of pending U.S. patent application Ser. No. 08/856,116, filed May 14, 1997, and which is hereby incorporated by reference.

BACKGROUND OF THE INVENTION

1. Field of the Invention

Embodiments of the invention relate to a deposition sequence and related hardware for manufacturing a plug and line typical of a dual damascene structure utilizing a thin conformal barrier layer formed on the walls of the feature.

2. Description of the Related Art

Modern semiconductor integrated circuits usually involve multiple conductive layers separated by dielectric (insulating) layers, such as oxide layers. The conductive layers are electrically interconnected by holes penetrating the intervening oxide layers and contacting some underlying conductive feature. After the holes are etched, they are filled with a metal, typically aluminum or copper, to electrically connect the conductive layers with each other. In a circuit formed by a dual damascene process, there are two types of holes, vias and trenches, which penetrate dielectric layers of the circuit. Vias are holes which extend to an underlying conductive feature. Vias which are filled with a metal are called plugs, or via plugs. Trenches are holes which extend into the dielectric layer of the circuit, but do not extend to an underlying conductive feature. Trenches which are filled with a metal are called lines, which serve as horizontal interconnects in a circuit.

As sizes of features such as holes in integrated circuits continue to decrease, the characteristics of the material forming the plugs become increasingly important. The smaller the plug, the less resistive the material forming the plug should be for speed performance. Copper is a material which is becoming more important as a result. Copper has a resistivity of 1.7 μΩ-cm. Copper has a small RC time constant thereby increasing the speed of a device formed thereof. In addition, copper exhibits improved reliability over aluminum in that copper has excellent electromigration resistance and can drive more current in the lines.

One problem with the use of copper is that copper diffuses into silicon dioxide, silicon and other dielectric materials. Therefore, barrier layers become increasingly important to prevent copper from diffusing into the dielectric materials and compromising the integrity of the device. Barrier materials such as Ta, TaN, SiN, Ti, TiN, W, and WN on the interlayer dielectric will effectively inhibit interlayer diffusion. However, within the same dielectric layer it is difficult to provide an effective barrier to prevent leakage between lines. Several technologies, such as physical vapor deposition (PVD), are presently under investigation for adding a barrier layer to the via sidewall separating the copper metal from the interlayer dielectric. However, common PVD technologies are limited in high aspect structures due to the directional nature of their deposition. Thus, the thickness of a barrier layer deposited by PVD will depend directly upon the structure architecture, with the barrier becoming thinner on the sidewall near the structure bottom. The barrier thickness, and therefore the barrier integrity may be compromised on the sidewall near the structure bottom. Also, the bottom corners of vias often do not form precise right angles at their intersection. Instead, there may be recesses or "undercuts" 11 at the bottom corners of vias 10 formed in a dielectric layer 12, as shown in FIG. 1. As a result, it is difficult to deposit a barrier layer that covers these undercuts by PVD because of the limited directionality of deposition by PVD.

In contrast, chemical vapor deposition (CVD) and atomic layer deposition (ALD) deposited films are, by their nature, conformal in re-entrant structures. Silicon nitride ($Si_xN_y$) and titanium nitride (TiN) prepared by decomposition of an organic material, tetrakis(dimethylamido) titantium (TDMAT) are common semiconductor manufacturing materials which display the described conformal performance. Both materials are perceived as being good barriers to Cu diffusion, but are considered unattractive due to their high resistivity. The highly resistive nature of these materials detrimentally affects the conductivity between the plug and the underlying conductive features, which must be maintained as low as possible to maximize logic device performance.

Therefore, there is a need for a process sequence and related hardware which provides a good barrier layer on the via sidewall, but which does not negatively affect the conductivity of the plug.

SUMMARY OF THE INVENTION

Embodiments of the present invention generally provide a process and related hardware for filling a patterned feature on a substrate with copper or other conductive materials. One embodiment of the present invention comprises forming a generally conformal CVD or ALD barrier layer over a patterned feature formed in a substrate, etching the barrier layer at the bottom of the patterned feature, depositing a second barrier layer that does not significantly impact conductivity between the plug and the underlying layer, but provides an adequate barrier on other surfaces, and then filling the patterned feature with a conductive material, such as copper. Another embodiment of the present invention comprises forming a generally conformal CVD or ALD barrier layer over a patterned feature formed in a substrate having an etch stop, etching the barrier layer and the etch stop at the bottom of the patterned feature, depositing a second barrier layer, and then filling the patterned feature with a conductive material, such as copper.

BRIEF DESCRIPTION OF THE DRAWINGS

So that the manner in which the features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
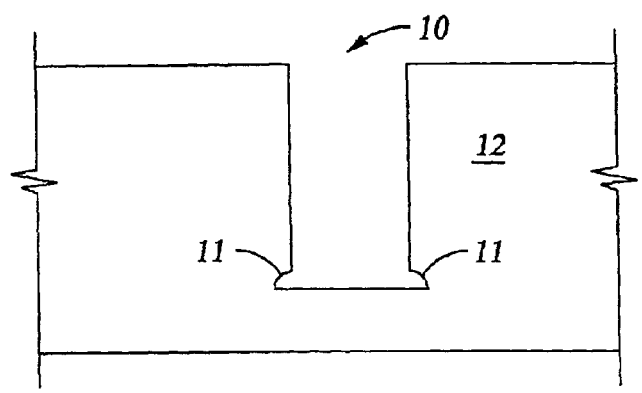
FIG. 1 is a partial cross-sectional view of a substrate having undercuts at the bottom of its via, as known in the prior art.
Figure 2:
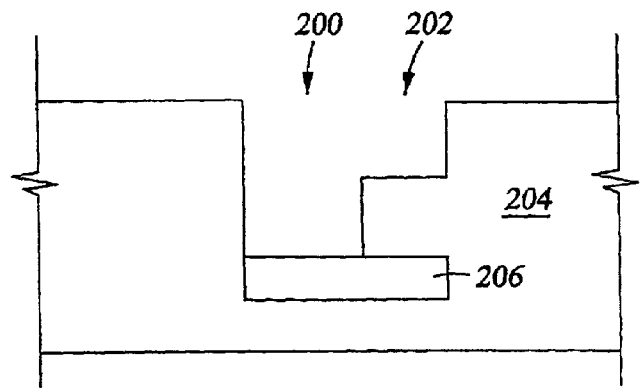
FIGS. 2–8 are partial cross-sectional views of a substrate having one process sequence of the present invention performed thereon.
Figure 3:
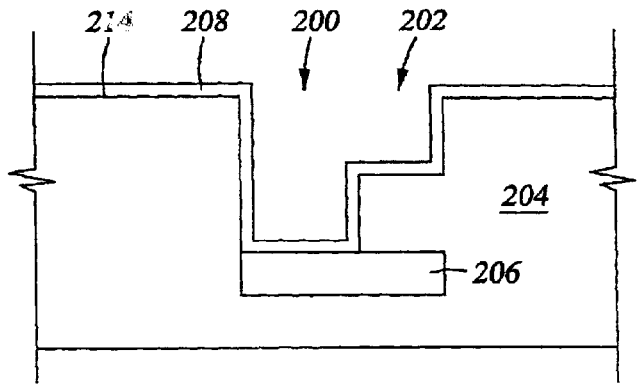

FIGS. 2–8 illustrate and describe one embodiment of a process sequence of the present invention. FIG. 2 is a partial cross sectional view of a substrate having a via 200 and a trench 202 formed thereon through a dielectric layer 204 to an underlying metal layer 206. A conformal barrier layer 208, shown in FIG. 3, is formed over the patterned surface by CVD techniques, such as conventional CVD and rapid CVD, or atomic layer deposition (ALD). The barrier layer deposited by CVD may be formed from materials such as $Si_xN_y$, $TiSi_xN$, TiN(C), TiNSi(C), Ta, TaC, TaN(C), TaNSi(C), W, $WN_x$, $SiO_xN_y$, SiC, AlN, or $Al_2O_3$.

Figure 4:
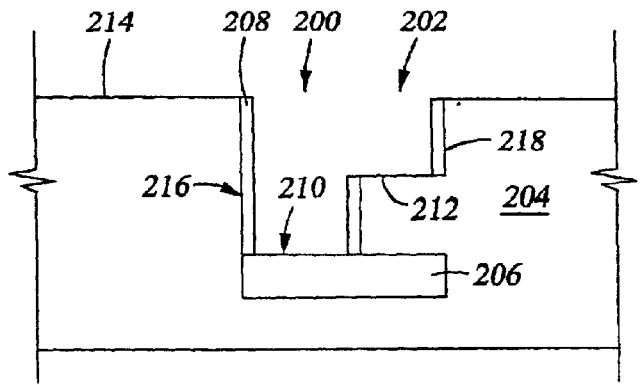

While the barrier layer 208 deposited by CVD or ALD provides desired conformal coverage of a substrate, including the sidewalls 216 and 218 of the via and the trench, respectively (FIG. 4), the barrier layer 208 also covers the lower portion of the via (FIG. 3), which contacts the underlying metal layer 206. The barrier layer 208 on the underlying metal layer 206 increases the resistance of the overall structure, and negatively impacts the performance of the structure. Thus, the substrate is exposed to a pre-clean or other etching process, such as an argon/hydrogen etch process to remove a portion of the barrier layer formed on the horizontal surfaces of the patterned feature, i.e, the bottom of the via 210 at the interface with the underlying metal layer 206, the bottom of the trench 212, and the field surface 214, as shown in FIG. 4. The etching may also extend into and remove part of the underlying metal layer (not shown). Preferably, the etching process is performed within a system that also includes the chamber in which the barrier layer 208 is deposited by chemical vapor deposition, so that the substrate is not exposed to air. More preferably, the etching process is performed within the same chamber in which chemical vapor deposition of the barrier layer is performed. However, in another embodiment, there is an air break in which the substrate is moved out of the processing system after the deposition of the barrier layer 208 and before the etching process.

Removing the barrier layer 208 from the bottom of the via 210 ensures a good, low resistance electrical contact to the underlying metal layer 206. However, removing the barrier layer 208 from another surface of the patterned feature, i.e., the bottom of the trench 212, leaves the dielectric layer 204 exposed at the bottom of the trench 212.

Figure 5:
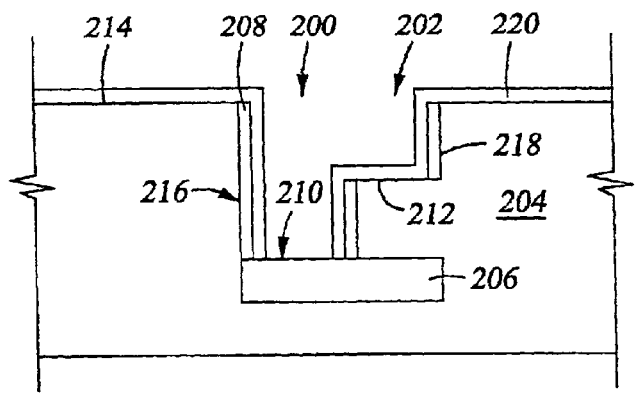

In the present invention, following the etch process, a second barrier layer 220, such as Ta, TaN, $TiSiN_x$, $TaSiN_x$, W, or $WN_x$ is sputter deposited using PVD onto the first barrier layer 208 and the exposed dielectric layer at the bottom of the trench 212, as shown in FIG. 5. The PVD barrier layer 220 covers the bottom of the trench 212 and the field surface 214. The PVD barrier layer 220 on the bottom of the trench 212 covers the dielectric layer at the bottom of the trench which was previously exposed during the etching process to remove the barrier layer 208 from the bottom of the via 210. The PVD barrier layer 220 may also partially or completely cover the vertical surfaces of the patterned feature, such as the sidewalls 216, 218 of the trench 202 and the via 200, respectively. However, the deposition of the PVD barrier layer 220 is minimized at the bottom of the via 210. At this point in the process, the aspect ratio of the via will typically be in the range of about 4 to 1, and the aspect ratio of the trench will typically be in the range of about 1 to 1. Because of the high aspect ratio/narrow opening of the via 200, few of the atoms or molecules sputtered by PVD will be sputtered at the appropriate angle to reach the bottom of the via 210. High density plasma PVD (HDP-PVD) or other directional PVD techniques may be used to further minimize deposition on the bottom of the via.

In another embodiment, the second barrier layer is deposited, at least partially, at the bottom of the via (not shown). For example, the barrier layer may have a thickness of from about 20 Å to about 50 Å at the bottom of the via. Preferably, the PVD barrier layer covering the bottom of the via has a low resistance. Examples of barrier layers with a low resistance, e.g., less than about 250 μΩ-cm, include PVD Ta, TaN, W, $WN_x$, Ti, and TiN layers. Preferably, the second barrier layer deposited by physical vapor deposition is sufficient to provide a barrier on the bottom of the trench without significantly impairing conduction between the conductive material that is deposited later in the via and the underlying metal layer.

Figure 6:
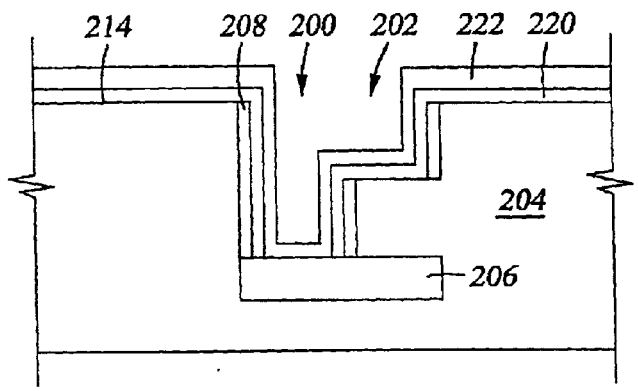

A copper seed layer 222 is then deposited on the patterned substrate by a PVD, CVD, or electroless deposition, as shown in FIG. 6. A seed layer is a layer on which a subsequent metal layer can be deposited by a process such as PVD, CVD, or electroplating. Copper is deposited on the seed layer by PVD, CVD, or electroplating to fill the trench and via features on the patterned substrate (not shown).

Figure 7:
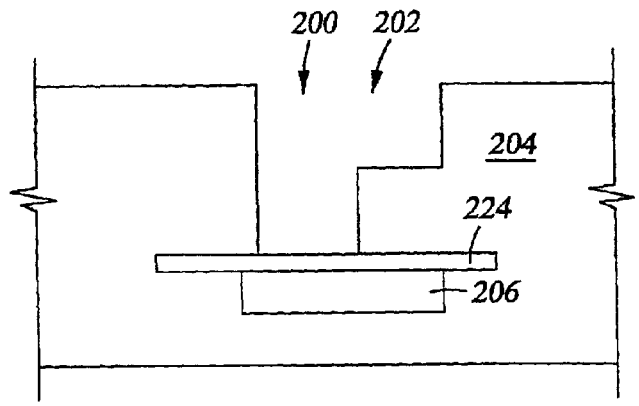
Figure 8:
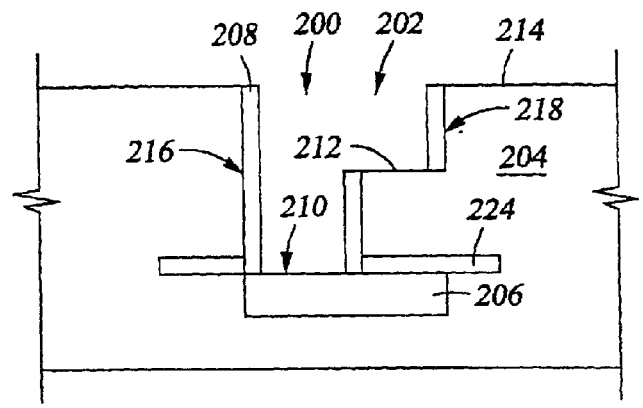

A similar process sequence may be performed on a patterned substrate with an etch stop, such as a nitride etch stop, at the via level. FIG. 7 shows the starting material patterned substrate with an etch stop 224 disposed at the bottom of the feature. The steps of a preferred embodiment of this method are illustrated by FIGS. 2, 3, 8, and 5. FIG. 8 shows that the etch stop 224 is removed from the bottom of the via 210 during the etching step which removes the barrier layer 208 from the bottom of the via 210.

Figure 9:
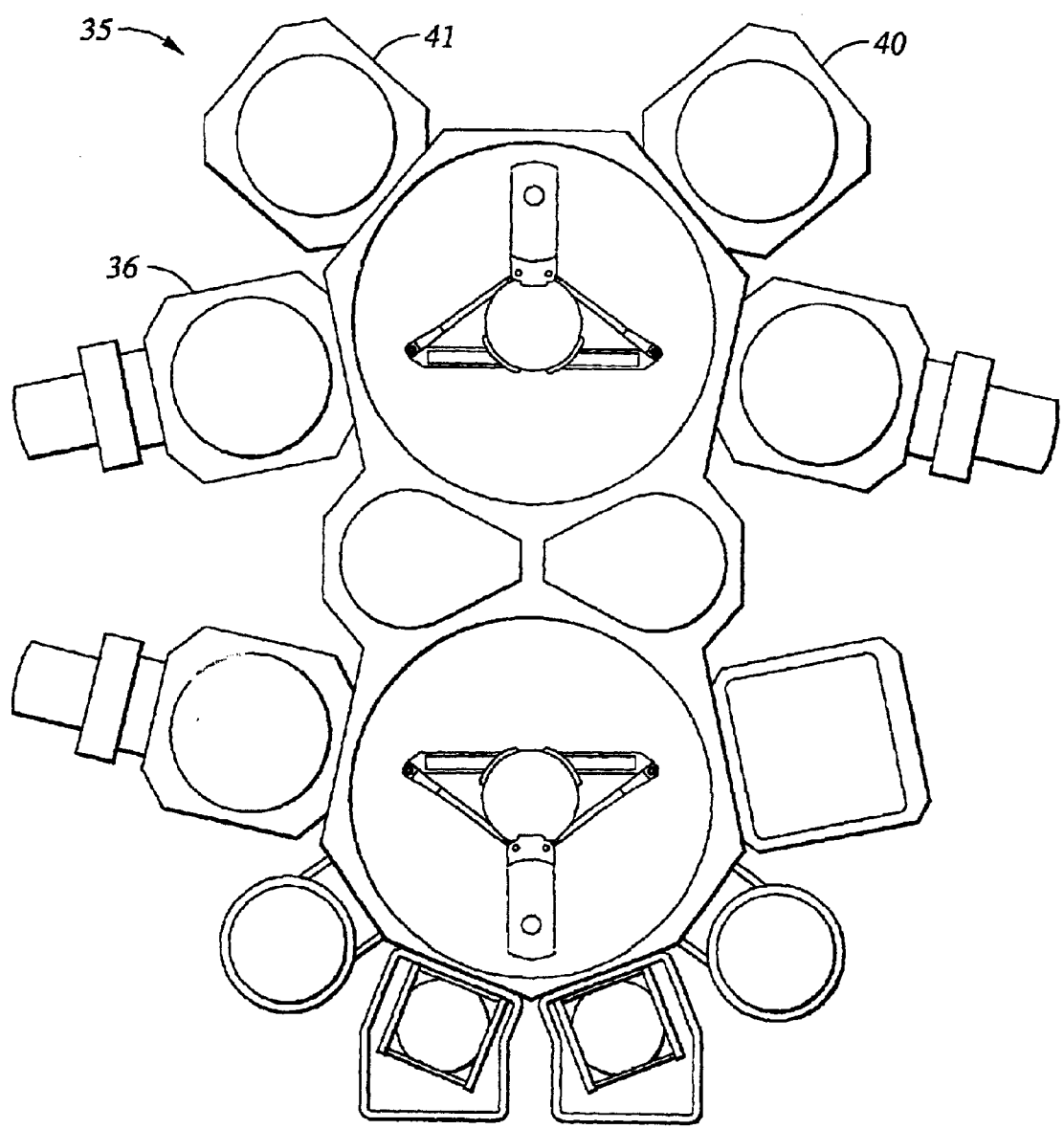
FIG. 9 is a schematic of a multichamber processing apparatus.

A schematic of a multichamber processing apparatus 35 suitable for performing the processes of the present invention is illustrated in FIG. 9. The apparatus is an "ENDURA" system commercially available from Applied Materials, Santa Clara, Calif. The particular embodiment of the apparatus 35 shown herein is suitable for processing planar substrates, such as semiconductor substrates, and is provided to illustrate the invention, and should not be used to limit the scope of the invention. The apparatus 35 typically comprises a cluster of interconnected process chambers 36, for example, CVD and PVD deposition and rapid thermal annealing chambers.

Figure 10:
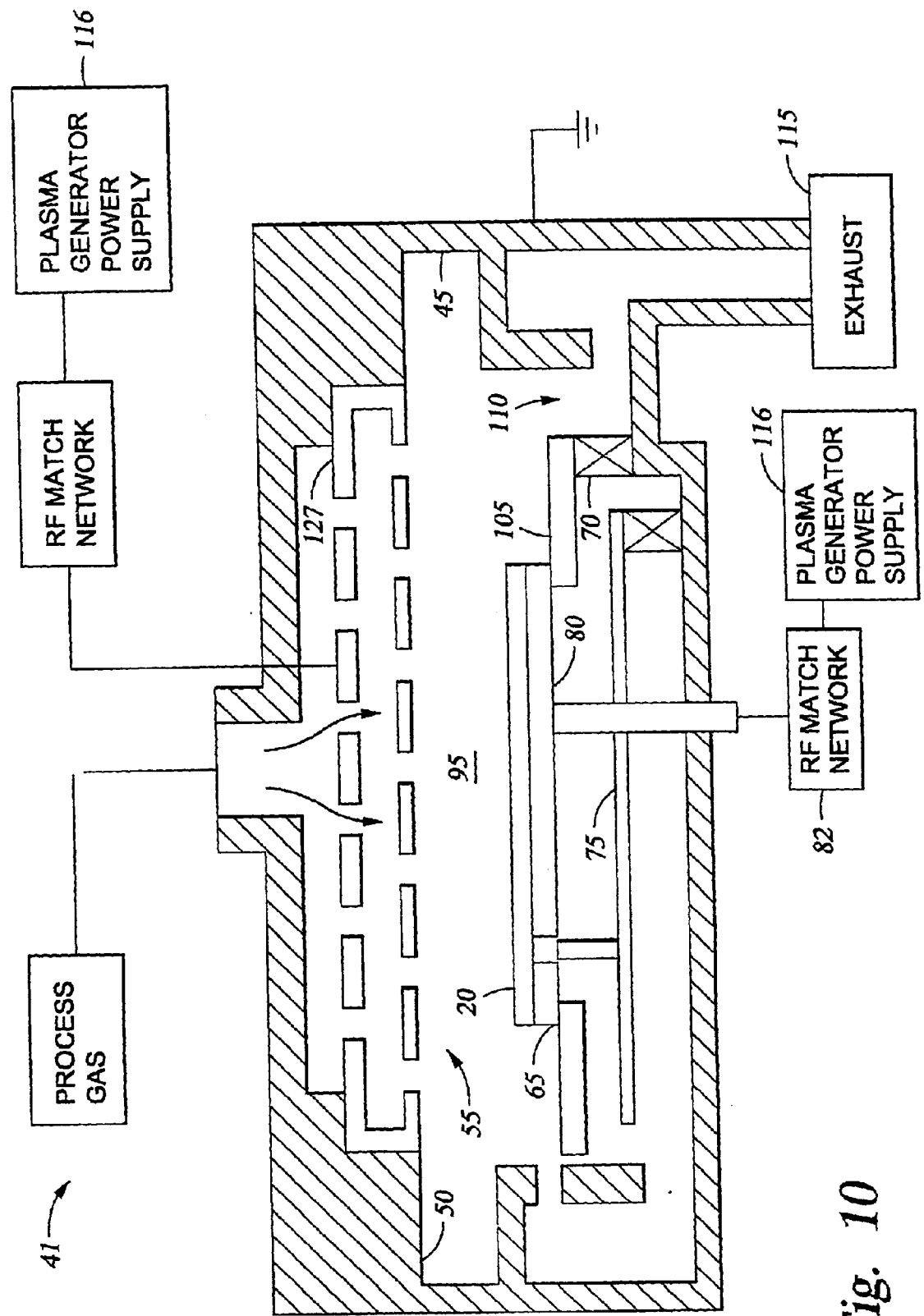
FIG. 10 is a cross-sectional view of a CVD process chamber.

The apparatus comprises a CVD deposition chamber 41 (shown in FIG. 10) which is used to deposit the conformal barrier layer 208 in one embodiment. The CVD deposition chamber 41 has surrounding sidewalls 45 and a ceiling 50. The chamber 41 comprises a process gas distributor 55 for delivering process gases into the chamber. Mass flow controllers and air operated valves are used to control the flow of process gases into the deposition chamber 41. The gas distributor 55 is typically mounted above the substrate (as shown), or peripherally about the substrate (not shown). A support 65 is provided for supporting the substrate in the deposition chamber 41. The substrate is introduced into the chamber 41 through a substrate loading inlet in the sidewall 45 of the chamber 41 and placed on the support 65. The support 65 can be lifted or lowered by support lift bellows 70 so that the gap between the substrate and gas distributor 55 can be adjusted. A lift finger assembly 75 comprising lift fingers that are inserted through holes in the support 65 can be used to lift and lower the substrate onto the support to facilitate transport of the substrate into and out of the chamber 41. A thermal heater 80 is then provided in the chamber to rapidly heat the substrate. Rapid heating and cooling of the substrate is preferred to increase processing throughput, and to allow rapid cycling between successive processes operated at different temperatures. The temperature of the substrate is generally estimated from the temperature of the support 65.

The substrate is processed in a process zone 95 above a horizontal perforated barrier plate 105. The barrier plate 105 has exhaust holes 110 which are in fluid communication with an exhaust system 115 for exhausting spent process gases from the chamber 41. A typical exhaust system 115 comprises a rotary vane vacuum pump (not shown) capable of achieving a minimum vacuum of about 10 mTorr, and optionally a scrubber system for scrubbing byproduct gases. The pressure in the chamber 41 is sensed at the side of the substrate and is controlled by adjusting a throttle valve in the exhaust system 115.

A plasma generator 116 is provided for generating a plasma in the process zone 95 of the chamber 40 for plasma enhanced chemical vapor deposition processes. The plasma generator 116 can generate a plasma (i) inductively by applying an RF current to an inductor coil encircling the deposition chamber (not shown), (ii) capacitively by applying an RF current to process electrodes in the chamber, or (iii) both inductively and capacitively while the chamber wall or other electrode is grounded. A DC or RF current at a power level of from about 750 Watts to about 2000 Watts can be applied to an inductor coil (not shown) to inductively couple energy into the deposition chamber to generate a plasma in the process zone 95. When an RF current is used, the frequency of the RF current is typically from about 400 KHz to about 16 MHZ, and more typically about 13.56 MHZ Optionally, a gas containment or plasma focus ring (not shown), typically made of aluminum oxide or quartz, can be used to contain the flow of process gas or plasma around the substrate.

In another embodiment, a conformal barrier layer 208 is formed over the patterned surface by atomic layer deposition (ALD). The ALD barrier layer may be formed from materials such as Ta, TaN, W, or WN. Examples of ALD processes are described in commonly assigned U.S. patent application Ser. No. 09/754,230, entitled "Method of Forming Refractory Metal Nitride Layers Using Chemisorption Techniques," filed on Jan. 3, 2001, U.S. patent application Ser. No. 09/960,469, entitled "Formation of Refractory Metal Nitrides Using Chemisorption Techniques," filed on Sep. 19, 2001, and U.S. patent application Ser. No. 09/965,370, entitled "Integration of Barrier Layer and Seed Layer," filed on Sep. 26, 2001, which are hereby incorporated by reference.

Generally, ALD can be used to deposit monolayers of materials, such as monolayers of a nitrogen-based compound and a metal containing compound, which are alternately chemisorbed on a substrate. For example, a monolayer of a nitrogen-based compound is chemisorbed on a substrate by introducing a pulse of a nitrogen-based gas into a processing chamber. After the monolayer is chemisorbed onto the substrate, excess nitrogen-based compound is removed from the processing chamber by introducing a pulse of purge gas thereto. Purge gases, such as, for example, helium (He), argon (Ar), nitrogen ($N_2$), and hydrogen ($H_2$), and other gases, may be used. After the pulse of purge gas, a pulse of a metal containing compound is introduced into the processing chamber to chemisorb a monolayer of metal containing compound on the substrate. The metal containing compound may be provided as a gas or may be provided with the aid of a carrier gas. Examples of carrier gases which may be used include, but are not limited to, helium (He), argon (Ar), nitrogen ($N_2$), and hydrogen ($H_2$).

In another embodiment of ALD, instead of using pulses of a purge gas between the pulses of a nitrogen-based compound and a metal containing compound, the purge gas is continuously flowed, i.e., both during the pulses of a nitrogen-based compound and the pulses of a metal containing compound, and in between these pulses.

One exemplary process of depositing a tantalum nitride barrier layer by atomic layer deposition in a processing chamber comprises sequentially providing pentadimethylamino-tantalum (PDMAT) at a flow rate between about 100 sccm and about 1000 sccm, and preferably between about 200 sccm (standard cubic centimeters per minute) and 500 sccm, for a time period of about 1.0 second or less, providing ammonia at a flow rate between about 100 sccm and about 1000 sccm, preferably between about 200 sccm and 500 sccm, for a time period of about 1.0 second or less, and a purge gas at a flow rate between about 100 sccm and about 1000 sccm, preferably between about 200 sccm and 500 sccm for a time period of about 1.0 second or less. The heater temperature preferably is maintained between about 100° C. and about 300° C. at a chamber pressure between about 1.0 and about 5.0 torr. This process provides a tantalum nitride layer in a thickness between about 0.5 Å and about 1.0 Å per cycle. The alternating sequence may be repeated until a desired thickness is achieved.

A pre-clean chamber which can be used to remove the barrier layer 208 from the bottom of the via 210 is the Pre-Clean II chamber available from Applied Materials, Inc. of Santa Clara, Calif. Additionally, other etch chambers known in the field could be used to remove the barrier layer as described. In a preferred embodiment, the CVD chamber 41 of FIG. 16 can be used to etch the CVD barrier layer deposited on the substrate. The support pedestal 82 may be used to bias the substrate. A plasma generator 116, as described above, is attached to the support pedestal 82. Argon is the principal etching gas. It ionizes in the chamber, and its positively charged ions are attracted to the negatively biased substrate with enough energy that the barrier layer 208 is removed from the horizontal surfaces of the patterned feature.

In another embodiment, the barrier layer 208 may be deposited and then removed from the bottom of the via 210 in an ALD chamber with plasma capability.

Figure 11:
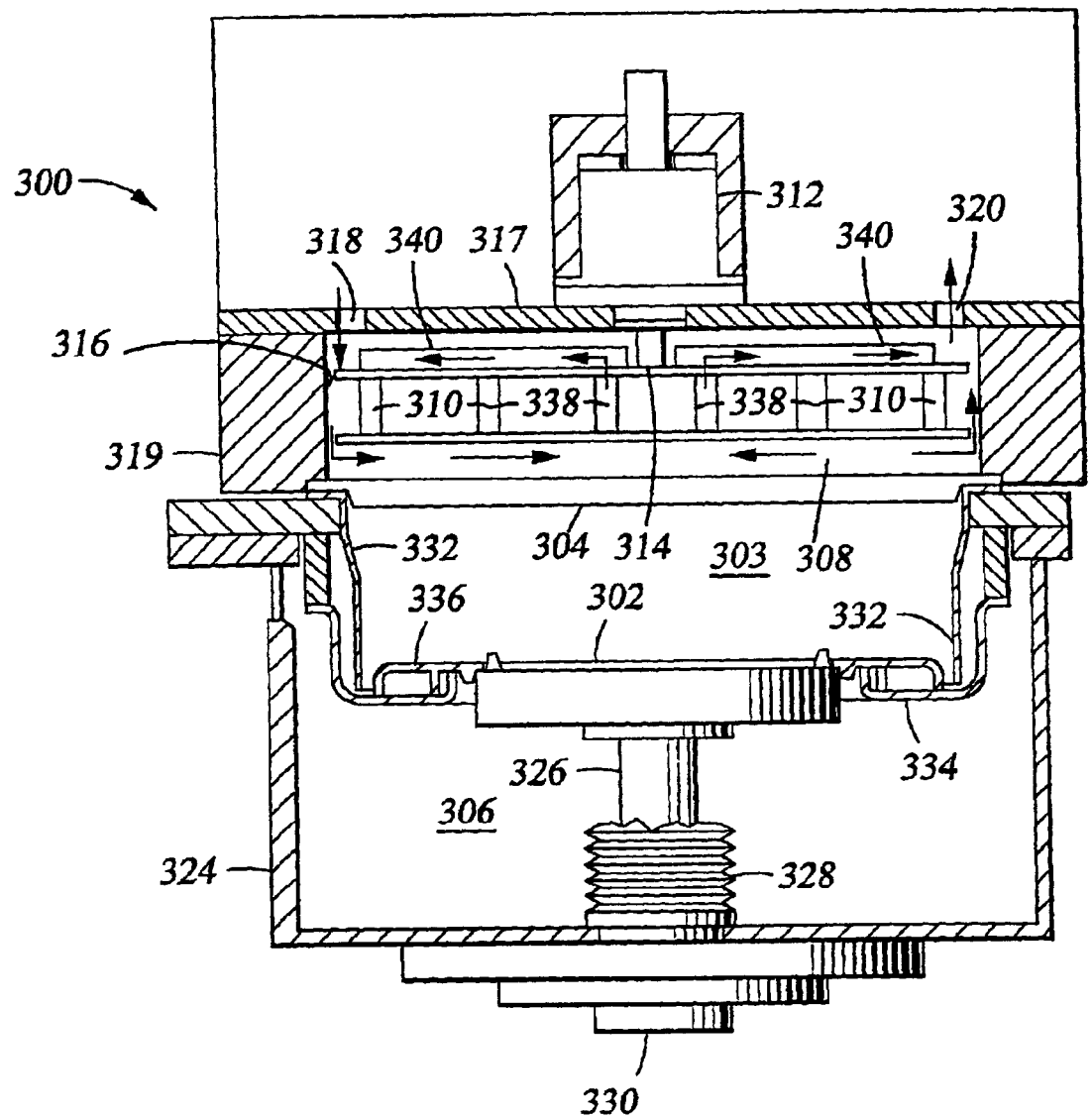
FIG. 11 is a cross-sectional view of a PVD process chamber.

A conventional PVD deposition chamber commercially available from Applied Materials, Santa Clara, Calif. can be used to deposit a second barrier layer 220 on a substrate. FIG. 11 shows a simplified example of a PVD chamber 300. The PVD chamber 300 generally includes a chamber section 306. The chamber section 306 generally includes a substrate support member 302 for supporting a substrate (not shown) to be processed, a target 304 for providing a material to be deposited on the substrate and a process environment 303 wherein a plasma is created for ions to sputter the target 304.

The PVD chamber 300 generally includes the substrate support member 302, also known as a susceptor or heater, disposed within the chamber section 306. The substrate support member 302 may heat the substrate if required by the process being performed. A target 304 is disposed in the top of the chamber section 306 to provide material, such as aluminum, titanium or tungsten, to be sputtered onto the substrate during processing by the PVD chamber 300. A lift mechanism, including a guide rod 326, a bellows 328 and a lift actuator 330 mounted to the bottom of the chamber section 306, raises the substrate support member 302 to the target 304 for the PVD chamber 300 to perform the process and lowers the substrate support member 302 to exchange substrates. A set of shields 332, 334, 336, disposed within the chamber section 306, surround the substrate support member 302 and the substrate during processing in order to prevent the target material from depositing on the edge of the substrate and on other surfaces inside the chamber section 306.

Situated above the chamber section 306 and sealed from the processing region of the chamber is a cooling chamber 316. The cooling chamber 316 is generally defined by the target 304, a top 317 and sides 319. A cooling fluid, such as water or antifreeze, flows into the cooling chamber 316 through inlet 318 and out of the cooling chamber 316 through outlet 320.

A rotating magnetron 308 is disposed in the cooling chamber 316 on the non-process environment side of the target 304 and surrounded by the cooling fluid. The magnetron 308 is isolated from the vacuum in the chamber section 306 by seals (not shown) between the magnetron chamber and target and between the target and processing region. The magnetron 308 has a set of magnets 310 arranged within the magnetron 308 so that they create magnetic field lines spinning across the sputtering surface of the target. Electrons are captured along these lines, where they collide with gas atoms, creating ions. To create this effect about the circumference of the target, the target is rotated during processing. The magnetron 308 is situated above the top side of the target 304 with about a one millimeter gap therebetween, so the magnetic fields from the magnets 310 may penetrate through the target 304. A motor assembly 312 for rotating the magnetron 308 is mounted to the top 317 of the cooling chamber 316. A shaft 314, which mechanically couples the motor assembly 312 to the rotational center of the magnetron 308, extends through the top 317. The motor assembly 312 imparts a rotational motion to the magnetron 308 to cause it to spin during performance of the substrate process.

A negative DC bias voltage of about 200 V or more is typically applied to the target 304, and a ground is applied to an anode, the substrate support member 302, and the chamber surfaces. The combined action of the dc bias and the rotating magnetron 308 generate an ionized plasma discharge in a process gas, such as argon, between the target 304 and the substrate. The positively charged ions are attracted to the target 304 and strike the target 304 with sufficient energy to dislodge atoms of the target material, which sputters onto the substrate.

The process can be implemented using a computer program product that runs on a conventional computer system comprising a central processor unit (CPU) interconnected to a memory system with peripheral control components, such as for example a 68400 microprocessor, commercially available from Synenergy Microsystems, California.

EXAMPLE 1

In one example, a process according to the present invention was performed on a substrate having a 0.25 µm via with about a 4:1 aspect ratio and a trench. The patterned substrate was first introduced into a CVD chamber, such as a TxZ® chamber, commercially available from Applied Materials, Inc., Santa Clara, Calif., where about 50 Å to about 100 Å of $Si_xN_y$ was deposited on the substrate using CVD techniques. The substrate was then moved into a Pre-clean II chamber (available from Applied Materials, Inc., located in Santa Clara, Calif.), where the substrate was subjected to an argon/hydrogen etching environment for about 20 seconds. RF/DC powers of about 300/300 W were used. Next, the substrate was moved into a PVD chamber where about 400 Å of TaN was deposited on the substrate in the field. Next, the substrate was introduced into a CVD chamber where about 400 Å of CVD Cu was deposited on the substrate as a wetting layer. Then, Cu was sputtered onto the substrate to complete the fill the via and the trench.

EXAMPLE 2

In another example, a patterned substrate with a dual damascene trench structure and a via opened to an underlying Cu wiring was first introduced into a multichamber processing apparatus having a sputter clean chamber, a CVD barrier chamber, a PVD barrier chamber, and a PVD Cu chamber. 50 Å of $TiSi_xN$ was deposited on the substrate in a CVD barrier chamber at a pressure of less than 10 Torr and at a temperature of about 300° C. to about 380° C. by reacting TDMAT in a $N_2/H_2$ environment to form a plasma. The substrate was then treated with a $SiH_4$ soak. The deposited $TiSi_xN$ conformally covered both the via and trench structure. In the next step, the substrate was moved to the sputter clean chamber, and subjected to argon/hydrogen etch to etch off the $TiSi_xN$ film deposited at the bottom of the via. The etching was continued past the bottom of the via into the underlying Cu wiring to remove about 5 to 10 Å of the underlying Cu wiring. The etch process also removed the $TiSi_xN$ film at the bottom of the trench structure. Next, the substrate was moved into a PVD Ta/aN chamber to receive a Ta/TaN film having a thickness at the bottom of the trench structure of about 30 Å. Then, the substrate was transferred into a PVD Cu chamber where about 1500 Å of Cu was deposited on the substrate with minimal deposition at the bottom of the via.

While the foregoing is directed to the preferred embodiment of the present invention, other and further embodiments of the invention may be devised without departing from the basic scope thereof, and the scope thereof is determined by the claims which follow.

What is claimed is:

1. A method of filling one or more of a via and a trench in a patterned substrate, comprising:
   a) depositing a generally conformal first barrier layer in one or more of the via and the trench on the patterned substrate by chemical vapor deposition, wherein the first barrier layer is selected from the group consisting of Ta, TaC, TaN(C), TaNSi(C), W, $WN_x$, $SiO_xN_y$, SiC, AlN, and $Al_2O_3$;
   b) removing the first barrier layer from the horizontal surfaces of the patterned substrate;
   c) depositing a second barrier layer by physical vapor deposition; and then
   d) depositing one or more conductive materials.

2. The method of claim 1 wherein depositing the conductive material comprises depositing a seed layer and a metal layer in the via and/or the trench after the second barrier layer is deposited.

3. The method of claim 2 wherein the first barrier layer is selected from the group consisting of Ta, TaC, TaN(C), W, $WN_x$, SiC, AlN, and $Al_2O_3$.

4. The method of claim 2 wherein the seed layer is copper.

5. The method of claim 4 wherein the metal layer is copper.

6. The method of claim 2 wherein the seed layer is deposited by physical vapor deposition.

7. The method of claim 2 wherein the seed layer is deposited by chemical vapor deposition.

8. The method of claim 2 wherein the seed layer is deposited by electroless deposition.

9. The method of claim 2 wherein the metal layer is deposited by physical vapor deposition.

10. The method of claim 2 wherein the metal layer is deposited by chemical vapor deposition.

11. The method of claim 2 wherein the metal layer is deposited by electroplating.

12. The method of claim 1 wherein the second barrier layer is selected from the group consisting of Ta, TaN, TiSiN$_x$, TaSiN$_x$, W, and WN$_x$.

13. The method of claim 1 wherein the first barrier layer is deposited and removed from the horizontal surfaces of the patterned substrate within a single chamber of an integrated processing tool.

14. The method of claim 13 wherein the chamber is a chemical vapor deposition chamber and the first barrier layer is deposited and etched in the chamber.

15. The method of claim 1 wherein the via has an aspect ratio of about 4 to 1 and the trench has an aspect ratio of about 1 to 1.

16. The method of claim 1 wherein the second barrier layer has a thickness of from about 20 Å to about 50 Å at the bottom of the via.

17. The method of claim 1 wherein the second barrier layer is selected from the group consisting of Ta, TaN, W, WN$_x$, Ti, and TiN, and the second barrier layer has a thickness of from about 20 Å to about 50 Å at the bottom of the via.

18. A method of filling one or more of a via and a trench in a patterned substrate, comprising:
   a) depositing a generally conformal first barrier layer on the patterned substrate by atomic layer deposition, wherein the first barrier layer is selected from the group consisting of Ta, TaN, W, and WN;
   b) removing the first barrier layer from the horizontal surfaces of the patterned substrate;
   c) depositing a second barrier layer by physical vapor deposition; and then
   d) depositing one or more conductive materials.

19. A method of filling one or more of a via and a trench in a patterned substrate having an etch stop at the via level, comprising:
   a) depositing a generally conformal first barrier layer on the patterned substrate by chemical vapor deposition;
   b) removing the first barrier layer from the horizontal surfaces of the patterned substrate;
   c) removing the etch stop from the bottom of the via;
   d) depositing a second barrier layer by physical vapor deposition; and then
   e) depositing one or more conductive materials.

20. The method of claim 19 wherein depositing the conductive material comprises depositing a seed layer and a metal layer in the via and/or the trench after the second barrier layer is deposited.

21. A method of filling one or more of a via and a trench in a patterned substrate having a metal layer underlying the via, comprising:
   a) depositing a generally conformal first barrier layer on the patterned substrate by chemical vapor deposition, wherein the first barrier layer is selected from the group consisting of Ta, TaC, TaN(C), TaNSi(C), W, WN$_x$, SiO$_x$N$_y$, SiC, AlN, and Al$_2$O$_3$;
   b) removing the first barrier layer from the horizontal surfaces of the patterned substrate;
   c) depositing by physical vapor deposition a second barrier layer sufficient to provide a barrier on the bottom of the trench without significantly impairing conduction between the conductive material deposited in the via and the metal layer; and then
   d) depositing one or more conductive materials.

* * * * *

UNITED STATES PATENT AND TRADEMARK OFFICE
CERTIFICATE OF CORRECTION

PATENT NO.       : 7,026,238 B2                                  Page 1 of 4
APPLICATION NO. : 10/052681
DATED            : April 11, 2006
INVENTOR(S)      : Ming Xi et al.

It is certified that error appears in the above-identified patent and that said Letters Patent is hereby corrected as shown below:

On the Cover Page:

Item [75], Inventors: Change Paul Frederick Smith's city of residence from "San Jose, CA" to --Campbell, CA--

Item [56], References Cited, U.S. PATENT DOCUMENTS: Please add the following references:

| | | | |
|---|---|---|---|
| -- 6,607,977 | 8/2003 | Rozbicki et al. | 438/627 |
| 6,498,091 | 12/2002 | Chen et al. | 438/627 |
| 2003/0087520 | 5/2003 | Chen et al. | 438/643 |
| 2002/0185370 | 12/2002 | Gopalraja et al. | 204/192.17 |
| 2002/0029958 | 3/2002 | Chiang et al. | 204/192.1 |
| 6,297,114 | 10/2001 | Iwata et al. | 438/305 |
| 5,792,272 | 8/1998 | Van Os et al. | 11B/723 IR |
| 5,759,635 | 6/1998 | Logan | 427/490 |
| 5,565,074 | 10/1996 | Qian et al. | 204/298.08 |
| 5,397,962 | 3/1995 | Moslehi | 315/111.51 |
| 4,419,202 | 10/1983 | Gibson | 204/192 N |
| 6,008,117 * | 12/1999 | Hong et al. | 438/629 |
| 6,093,639 * | 07/2000 | Wu et al. | 438/629 |
| 6,156,644 * | 12/2000 | Ko et al. | 438/639 |
| 5,818,110 * | 10/1998 | Cronin | 257/775 |
| 5,407,698 * | 4/1995 | Emesh | 427/99 |
| 5,391,517 * | 2/1995 | Gelatos et al. | 438/643 |
| 6,309,801 | 10/2001 | Meijer et al. | 430/313 |
| 6,274,483 | 8/2001 | Chang et al. | 438/640 |
| 6,271,592 | 8/2001 | Kim et al. | 257/751 |
| 6,271,084 | 8/2001 | Tu et al. | 438/253 |
| 6,268,283 | 7/2001 | Huang | 438/638 |
| 6,265,757 | 7/2001 | Brady et al. | 257/623 |
| 6,229,174 | 5/2001 | Parekh | 257/306 |
| 6,221,775 | 4/2001 | Ference et al. | 438/691 |
| 6,211,071 | 4/2001 | Lukanc et al. | 438/640 |
| 6,200,433 | 3/2001 | Ding et al. | 201/192.15 |
| 6,184,138 | 2/2001 | Ho et al. | 438/687 |
| 6,184,128 | 2/2001 | Wang et al. | 438/637 |
| 6,166,423 | 12/2000 | Gambino et al. | 257/532 |
| 6,164,138 | 12/2000 | Blake et al. | 73/732 |
| 6,164,128 | 12/2000 | Santa Cruz, et al. | 73/170.11 |

UNITED STATES PATENT AND TRADEMARK OFFICE
CERTIFICATE OF CORRECTION

PATENT NO. : 7,026,238 B2
APPLICATION NO. : 10/052681
DATED : April 11, 2006
INVENTOR(S) : Ming Xi et al.

It is certified that error appears in the above-identified patent and that said Letters Patent is hereby corrected as shown below:

Item [56], References Cited, U.S. PATENT DOCUMENTS (cont'd):

| | | | |
|---|---|---|---|
| 6,157,081 | 12/2000 | Nariman et al. | 257/752 |
| 6,157,061 | 12/2000 | Kawata | 257/316 |
| 6,143,646 | 11/1000 | Wetzel | 438/637 |
| 6,023,102 | 2/2000 | Nguyen et al. | 257/774 |
| 6,017,817 | 1/2000 | Chung et al. | 438/637 |
| 5,993,916 | 11/1999 | Zhao et al. | 427/535 |
| 5,930,669 | 7/1999 | Uzoh | 438/627 |
| 5,846,332 | 12/1998 | Zhao et al. | 118/728 |
| 5,674,787 | 10/1997 | Zhao et al. | 437/230 |
| 5,654,232 | 8/1997 | Gardner | 438/661 |
| 5,613,296 | 3/1997 | Kurino et al. | 29/852 |
| 5,565,029 | 10/1996 | Takasu | 117/1 |
| 5,534,460 | 7/1996 | Tseng et al. | 437/187 |
| 5,486,492 | 1/1996 | Yamamoto et al. | 437/192 |
| 5,371,042 | 12/1994 | Ong | 437/194 |
| 5,354,712 | 10/1994 | Ho et al. | 437/195 |
| 5,308,793 | 5/1994 | Taguchi et al. | 437/194 |
| 5,186,718 | 2/1993 | Tepman et al. | 29/25.01 |
| 5,178,739 | 1/1993 | Barnes et al. | 204/192.12 |
| 4,962,060 | 10/1990 | Sliwa et al. | 437/192 |
| 4,951,601 | 8/1990 | Maydan et al. | 118/719 -- |

Item [56], References Cited, FOREIGN PATENT DOCUMENTS: Please add the following references:

--JP        08-213,119        7/1996--

Item [56], References Cited, OTHER PUBLICATIONS: Please add the following references:

-- Ghandi, Sorab K., "VLSI Fabrication Principles, Silicon and Gallium Arsenide" Second Edition, Wiley-Interscience Publication (1994), Pages 617-620 and Page 652.

R. F. Bunshah, "Handbook of Deposition Technologies for Films and Coatings", 2$^{nd}$ edition, Noyas Publications, NJ, USA, 1994, 261, 321-325.

UNITED STATES PATENT AND TRADEMARK OFFICE
CERTIFICATE OF CORRECTION

PATENT NO. : 7,026,238 B2
APPLICATION NO. : 10/052681
DATED : April 11, 2006
INVENTOR(S) : Ming Xi et al.

It is certified that error appears in the above-identified patent and that said Letters Patent is hereby corrected as shown below:

Item [56], References Cited, OTHER PUBLICATIONS (cont'd):

Gardner et al., "Encapsulated Copper Interconnection Device using Sidewall Barriers", Thin Solid Films 262 (1995) 104-119.

Jang et al., "Tantalum and Niobium as a Diffusion Barrier between Copper and Silicon", J. Materials Science: Materials in Electronics 7 (1996) 271-278.

Tadashi Iijima, Yoshiakai Shimooka, and Kyoichi Suguro, "An Amorphous Ti-Si-N Diffusion Barrier Layer for Cu Interconnections," Vol. 78, No. 12, 1995, pages 67-74.

Mikagi H. Ishikawa, T. Usami, M. Suzuki, K. Inoue, N. Oda, S. Chikaki, I. Sakai and T. Kikkawa. "Barrier Metal Free Copper Damascene Interconnection Technology Using Atmospheric Copper Reflow and Nitrogen Doping in SiOF Film." 1996 IEEE. Pp. 365-368.

Y. Shacham-Diamand. V. Dubin, and M. Angyal "Electroless Copper Deposition for ULSI" 1995 Elsevier Science S.A., pp. 93-103.

Electromigration and Diffusion in Pure Cu and Cu(Sn) Alloys. C. K. Hu, K. L. Lee, D. Gupta, and P. Blauner, Mat. Res. Soc. Symp. Vol 427 (96-105).

Electromigration Failure Distributions for Multi-Large Interconnects as a Function of Line Width Experiments and Simulation, D.D. Brown, J.E. Sanchez, Jr., V. Pham, P.R. Besser, M.A. Korhonen, and C.Y. Li, Mat. Res. Soc. Symp. Vol 427.

USSN Serial No.: 09/635,738, Chen, et al., "Barrier Layer Structure for Copper Metallization and Method of Forming the Structure," Filed: August 09, 2000.

Column 5, Lines 34 and 35: Change each instance of "MHZ" to --MHz--

Column 5, Line 35: Add a period after "MHz"

Column 7, Line 47: Change "dc" to --DC--

Column 8, Line 12: After "fill", insert --of--

UNITED STATES PATENT AND TRADEMARK OFFICE
CERTIFICATE OF CORRECTION

PATENT NO. : 7,026,238 B2
APPLICATION NO. : 10/052681
DATED : April 11, 2006
INVENTOR(S) : Ming Xi et al.

It is certified that error appears in the above-identified patent and that said Letters Patent is hereby corrected as shown below:

Column 8, Line 33: Change "Ta/aN" to --Ta/TaN--

Signed and Sealed this

Fifteenth Day of May, 2007

JON W. DUDAS
*Director of the United States Patent and Trademark Office*